(12) United States Patent
Lin et al.

(10) Patent No.: US 12,033,871 B2
(45) Date of Patent: Jul. 9, 2024

(54) METHOD FOR FORMING SEMICONDUCTOR DIE PACKAGE WITH RING STRUCTURE COMPRISING RECESSED PARTS

(71) Applicant: Taiwan Semiconductor Manufacturing Company, Ltd., Hsinchu (TW)

(72) Inventors: Yu-Sheng Lin, Zhubei (TW); Shu-Shen Yeh, Taoyuan (TW); Chin-Hua Wang, New Taipei (TW); Po-Yao Lin, Zhudong Township (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/311,980

(22) Filed: May 4, 2023

(65) Prior Publication Data
US 2023/0274950 A1    Aug. 31, 2023

Related U.S. Application Data

(62) Division of application No. 17/462,505, filed on Aug. 31, 2021, now Pat. No. 11,676,826.

(51) Int. Cl.
*H01L 23/58*    (2006.01)
*H01L 21/56*    (2006.01)
(Continued)

(52) U.S. Cl.
CPC .......... *H01L 21/563* (2013.01); *H01L 21/565* (2013.01); *H01L 23/3142* (2013.01);
(Continued)

(58) Field of Classification Search
CPC ... H01L 21/563; H01L 21/565; H01L 23/585; H01L 24/97; H01L 25/0657; H01L 2224/04105; H01L 23/3142
(Continued)

(56) References Cited

U.S. PATENT DOCUMENTS

| 8,993,380 B2 | 3/2015 | Hou et al. |
| 9,281,254 B2 | 3/2016 | Yu et al. |

(Continued)

*Primary Examiner* — Didarul A Mazumder
(74) *Attorney, Agent, or Firm* — Birch, Stewart, Kolasch Birch, LLP

(57) ABSTRACT

A method for forming a semiconductor die package is provided, including disposing a first semiconductor die and a second semiconductor die over an interposer substrate, forming an underfill element over the interposer substrate to surround the first and second semiconductor dies, wherein a portion of the underfill element is between the semiconductor dies, stacking the interposer substrate over a package substrate, and installing a ring structure on the package substrate through an adhesive layer to surround the semiconductor dies. The ring structure has recessed parts recessed from its bottom surface. The recessed parts include first recessed parts arranged in at least one corner area of the ring structure and two second recessed parts arranged in two opposite side areas of the ring structure. The portion of the underfill element between the first and the second semiconductor dies is disposed between the two second recessed parts.

20 Claims, 15 Drawing Sheets

(51) Int. Cl.
*H01L 23/00* (2006.01)
*H01L 23/31* (2006.01)
*H01L 23/498* (2006.01)
*H01L 25/065* (2023.01)

(52) U.S. Cl.
CPC ...... *H01L 23/49838* (2013.01); *H01L 23/585* (2013.01); *H01L 24/05* (2013.01); *H01L 24/97* (2013.01); *H01L 25/0657* (2013.01); *H01L 2224/04105* (2013.01)

(58) Field of Classification Search
USPC .................................. 257/678; 438/106, 121
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2017/0162542 | A1* | 6/2017 | Chen .................. H01L 21/56 |
| 2018/0261554 | A1* | 9/2018 | Huang ................ H01L 23/04 |
| 2018/0342466 | A1* | 11/2018 | Lin .................... H01L 21/56 |
| 2019/0051621 | A1* | 2/2019 | Liu ................. H01L 23/49838 |
| 2020/0161275 | A1* | 5/2020 | Lin .................... H01L 23/5384 |
| 2020/0203186 | A1* | 6/2020 | Huang ................ H01L 25/50 |
| 2020/0211944 | A1* | 7/2020 | Lin .................... H01L 24/73 |
| 2020/0251427 | A1* | 8/2020 | Huang ................ H01L 23/04 |

* cited by examiner

METHOD FOR FORMING SEMICONDUCTOR DIE PACKAGE WITH RING STRUCTURE COMPRISING RECESSED PARTS

CROSS REFERENCE TO RELATED APPLICATIONS

This Application is a Divisional of U.S. application Ser. No. 17/462,505, filed on Aug. 31, 2021, the entirety of which is incorporated by reference herein.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

A package (structure) not only provides protection for semiconductor devices from environmental contaminants, but also provides a connection interface for the semiconductor devices packaged therein. Smaller package structures, which take up less area or are lower in height, have been developed to package the semiconductor devices.

Although existing packaging structures and methods for fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
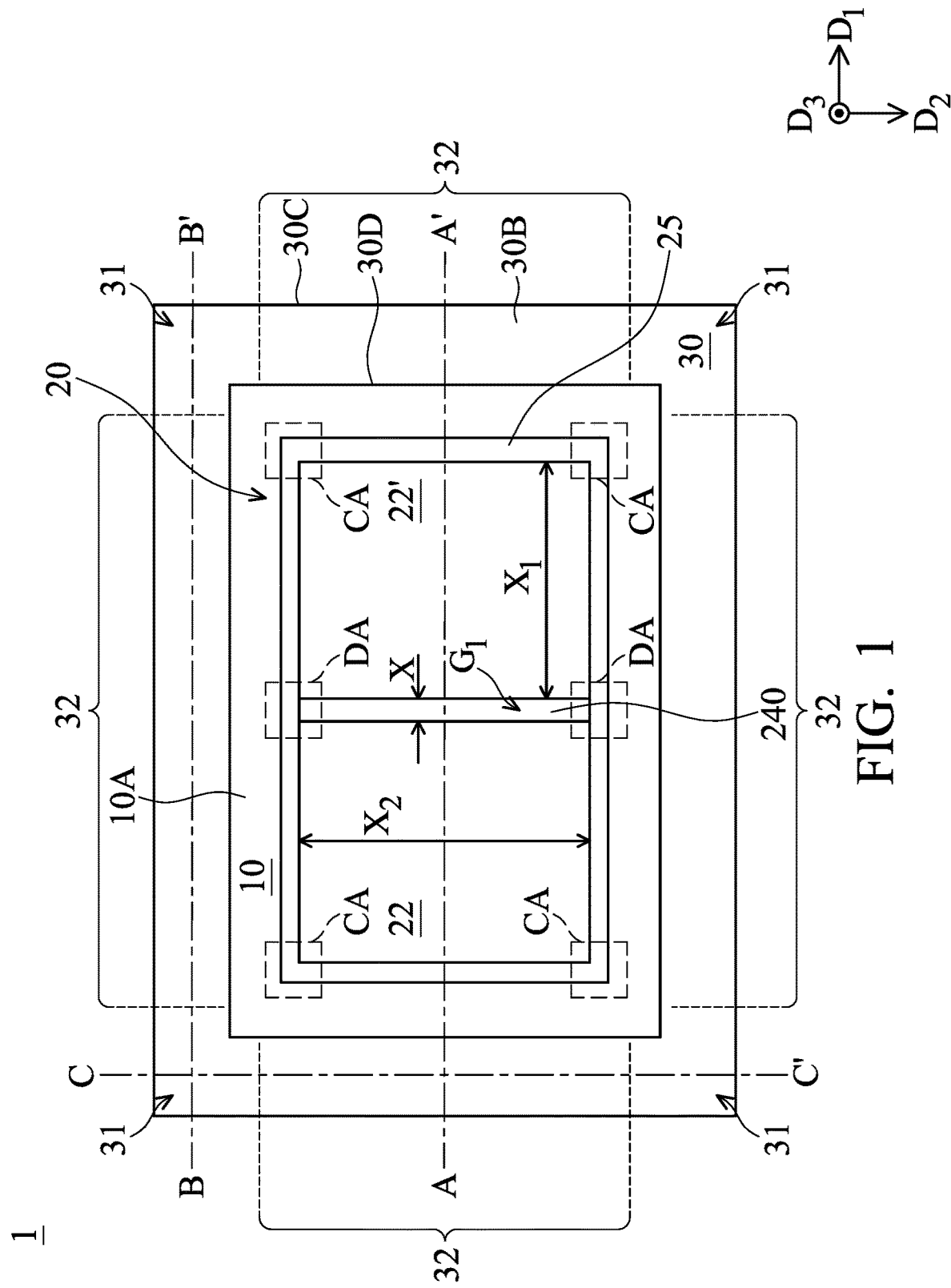
FIG. 1 is a schematic top view of a semiconductor die package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%. The terms "each" in the description are to be interpreted so as not to exclude variations among units and not to exclude an omission of a part of the units.

A semiconductor die package and the method for forming the same are provided in accordance with various embodiments. Some variations of some embodiments are discussed. Throughout the various views and illustrative embodiments, like reference numbers are used to designate like elements. In accordance with some embodiments of the present disclosure, a semiconductor die package includes a ring structure (stress-relief structure) for controlling warpage of a package substrate. In some embodiments, the ring structure has a fin profile on the bottom surface to reduce mechanical coupling effect and coefficient of thermal expansion (CTE) mismatch between the ring structure and the underlying package substrate, thereby reducing stress concentration or cracking in certain areas of the package, which will be described in detail below. Accordingly, the reliability of the entire package structure is improved.

Embodiments will be described with respect to a specific context, namely a packaging technique with an interposer substrate or other active chip in a two and a half dimensional integrated circuit (2.5 DIC) structure or a three dimensional IC (3 DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2A:
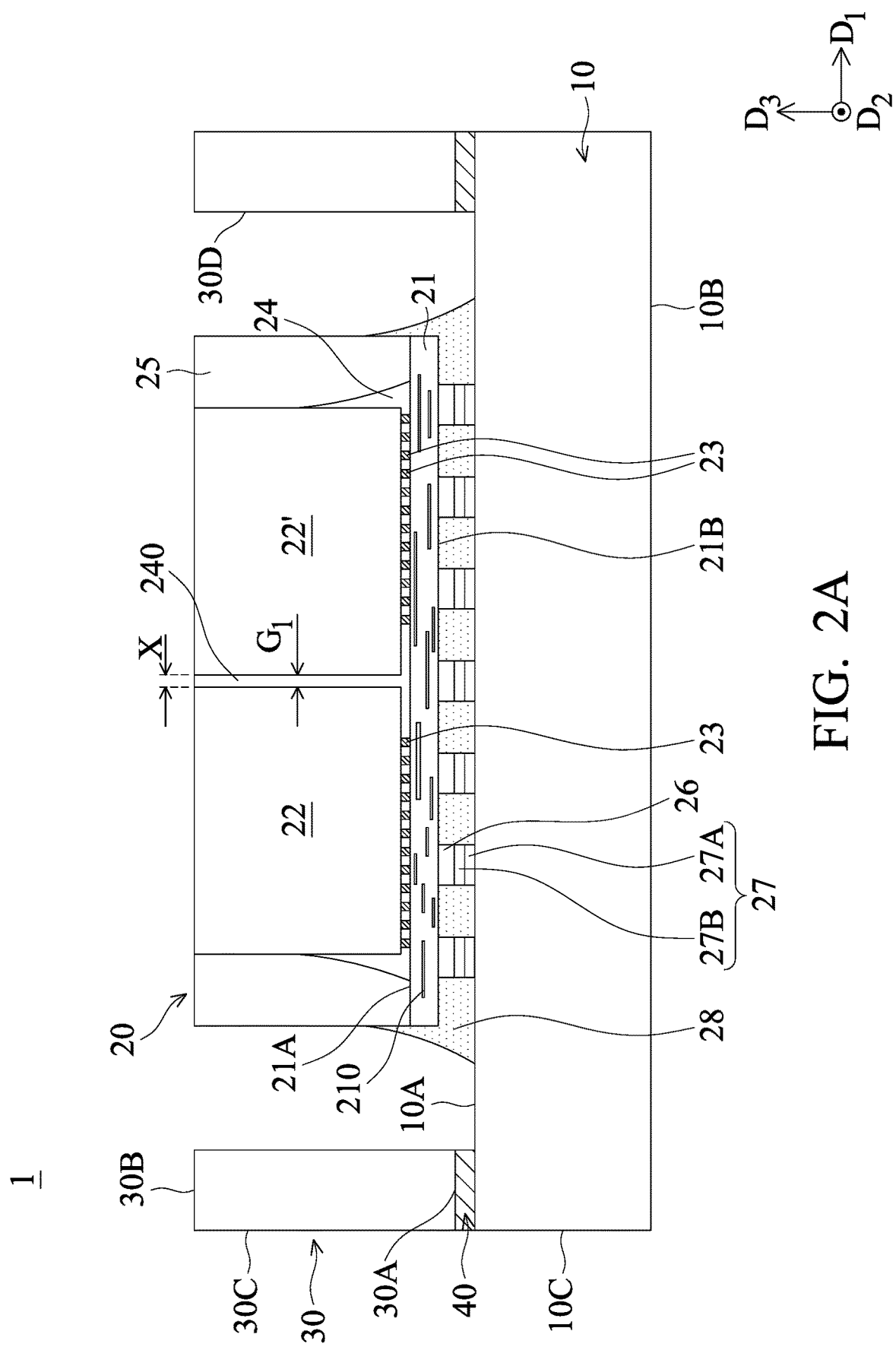
FIG. 2A is a schematic cross-sectional view of the semiconductor die package taken along line A-A' in FIG. 1.
Figure 2B:
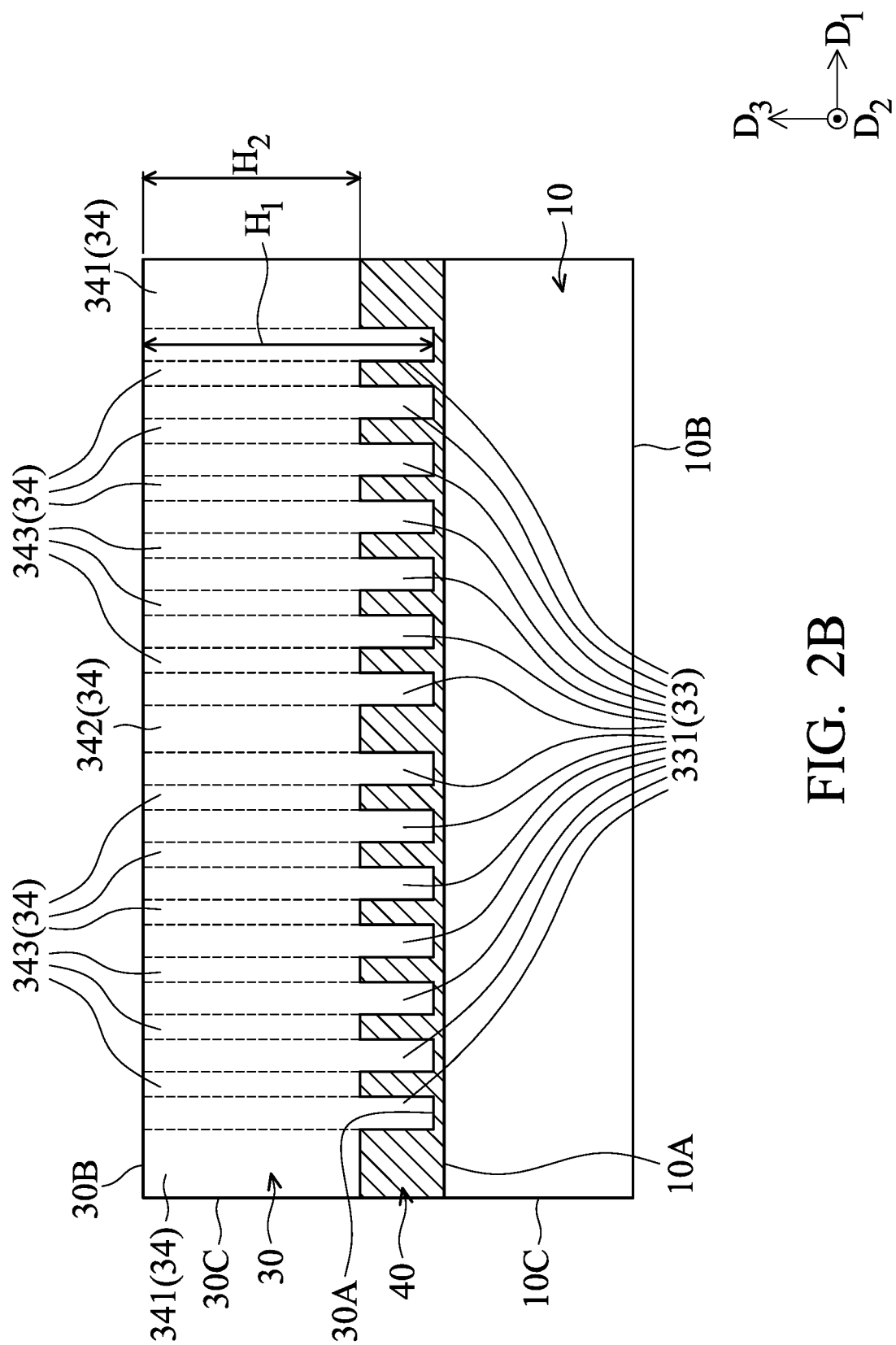
FIG. 2B is a schematic cross-sectional view of the semiconductor die package taken along line B-B' in FIG. 1.
Figure 2C:
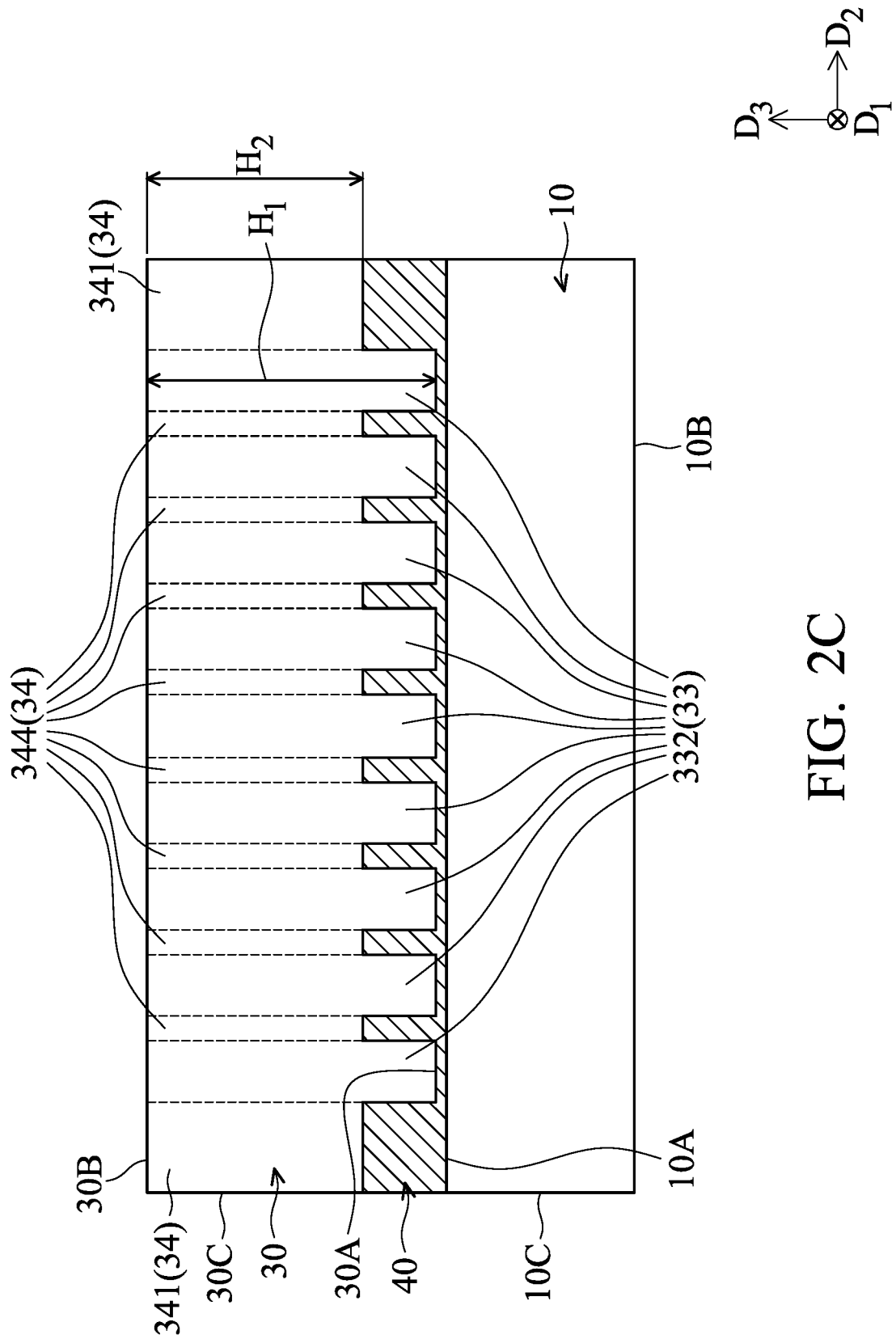
FIG. 2C is a schematic cross-sectional view of the semiconductor die package taken along line C-C' in FIG. 1.

FIG. 1 is a schematic top view of a semiconductor die package 1 in accordance with some embodiments of the disclosure. FIGS. 2A, 2B, and 2C are schematic cross-sectional views of the semiconductor die package 1 taken along line A-A', line B-B', and line C-C' in FIG. 1, respectively. As shown in FIGS. 1 and 2A-2C, the semiconductor die package 1 includes a package substrate 10, a package component 20, a ring structure 30, and an adhesive layer 40. Additional features can be added to the semiconductor device package 1, and/or some of the features described below can be replaced or eliminated in other embodiments.

The package substrate 10 is used to provide electrical connection between semiconductor devices packaged in the semiconductor device package 1 and an external electronic device (not shown). In some embodiments, the package substrate 10 is a semiconductor substrate. By way of example, the material of the package substrate 10 may include elementary semiconductor such as silicon or germanium; a compound semiconductor such as silicon germanium, silicon carbide, gallium arsenic, gallium phosphide, indium phosphide or indium arsenide; or combinations thereof. Alternatively, the package substrate 10 may be a silicon-on-insulator (SOI) substrate, a germanium-on-insulator (GOI) substrate, or the like. In some other embodiments, the package substrate 10 is a printed circuit board (PCB), a ceramic substrate, or another suitable package substrate. The package substrate 10 may be a core or a core-less substrate.

In some embodiments, the package substrate 10 has various device elements (not shown). Examples of device elements that are formed in or on the package substrate 10 may include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, resistors, capacitors, inductors, and/or other applicable device elements. Various processes can be performed to form the device elements, such as deposition, etching, implantation, photolithography, annealing, and/or other suitable processes. The package substrate 10 may also have one or more circuit layers (not shown) used to electrically connect the device elements and semiconductor devices that are subsequently attached.

The package substrate 10 generally has a rectangular (or square) shape in a top view (see FIG. 1), depending on design requirements, although other shapes may also be used. Also, the package substrate 10 has opposite surfaces 10A and 10B, which may be substantially parallel to each other. The surface 10A (the upper surface shown) may be used to receive and bond other package components of the package, which will be described further below. Several electrical connectors (not shown) may be provided on the surface 10B (the lower surface shown) to enable electrical connection between the semiconductor device package 1 and an external electronic device such as a PCB (not shown). The electrical connectors may be or include solder balls such as tin-containing solder balls.

The package component 20 is disposed over the surface 10A of the package substrate 10. In some embodiments, the package component 20 is a package module, which includes an interposer substrate 21 and semiconductor dies 22 and 22' disposed over the interposer substrate 21, as shown in FIG. 2A. Although there are two semiconductor dies 22 and 22' in this case, more dies may be used in different embodiments.

In some embodiments, the interposer substrate 21 includes conductive features 210 therein, such as conductive lines and conductive vias (sometimes collectively referred to as a redistribution layer (RDL) structure), to electrically connect contact pads (not shown) exposed at opposite surfaces 21A and 21B of the interposer substrate 21, as shown in FIG. 2A. The interposer substrate 21 may include an organic interposer substrate, a silicon interposer substrate, or the like. The materials and formation method of the interposer substrate 21 are well known in the art and therefore not described herein.

In some embodiments, the semiconductor dies 22 and 22' may be integrated circuit (IC) chips or dies, which may include a semiconductor substrate having a plurality of semiconductor devices (e.g., transistors, diodes, passive devices, etc.) thereon to form a functional integrated circuit. The functional integrated circuit may include a processor, logic circuitry, memory, analog circuit, digital circuit, mixed signal circuit, or the like. In some alternative embodiments, each of the semiconductor dies 22 and 22' may be a System on a Chip (SoC) or a System on Integrated Circuit (SoIC) device or package that includes two or more chips/dies with integrated functions. Each of the semiconductor dies 22 and 22' can be obtained, for example, by sawing or dicing a semiconductor wafer (with several IC dies formed thereon) along scribed lines to separate the semiconductor wafer into a plurality of individual semiconductor dies.

In some embodiments, the semiconductor dies 22 and 22' can be placed (for example, using a pick-and-place tool, not shown) over the surface 21A (the upper surface shown) of the interposer substrate 21 in such a way that their respective active surfaces (e.g., the lower surfaces shown in FIG. 2A) face the surface 21A, and are bonded to the interposer substrate 21 through electrical connectors 23 formed between contact pads (not shown) exposed at the active surfaces of the semiconductor dies 22 and 22' and contact pads exposed at the surface 21A of the interposer substrate 21 (this is the so-called "flip-chip bonding"). The electrical connectors 23 are used to electrically connect the semiconductor dies 22 and 22' to the interposer substrate 21. The electrical connectors 23 may include conductive pillars, solder balls, controlled collapse chip connection (C4) bumps, micro bumps, one or more other suitable bonding structures, or a combination thereof.

In some embodiments, the electrical connectors 23 may be made of or include a metal material, such as copper, aluminum, gold, nickel, silver, palladium, or the like, or a combination thereof, and may be formed using an electroplating process, an electroless plating process, a placement process, a printing process, a physical vapor deposition (PVD) process, a chemical vapor deposition (CVD) process, a photolithography process, one or more other applicable processes, or a combination thereof.

Alternatively, the electrical connectors 23 may be made of a tin-containing material. The tin-containing material may further include copper, silver, gold, aluminum, lead, one or more other suitable materials, or a combination thereof. In some other embodiments, the electrical connectors 23 are lead-free. A reflow process may be performed in order to shape the tin-containing material into the desired bump or ball shapes.

In some embodiments, an underfill element 24 is also formed over the surface 21A of the interposer substrate 21 to surround and protect the above electrical connectors 23 and the semiconductor dies 22 and 22' (for example, the underfill element 24 may extend laterally beyond the periphery of the semiconductor dies 22 and 22', as shown in FIG. 2A), and enhances the connection between the semiconductor dies 22 and 22' and the interpose substrate 21. The underfill element 24 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into the gap between each semiconductor die 22/22' and the interposer substrate 21 to reinforce the strength of the electrical connectors 23 and therefore the overall package structure. After the dispensing, the underfill material is cured to form the underfill element 24.

In some embodiments, the semiconductor dies 22 and 22' are arranged side by side (in a first (horizontal) direction $D_1$) above the interposer substrate 21, and the formed underfill element 24 further extends vertically (in a vertical direction $D_3$) to fill the gap between the semiconductor dies 22 and 22', as shown in FIGS. 1 and 2A. For example, a portion 240 of the underfill element 24 is in the gap G1 between the adjacent semiconductor dies 22 and 22'.

In some embodiments, a molding layer 25 is also formed over the surface 21A of the interposer substrate 21 to surround and protect the semiconductor dies 22 and 22' and the underfill element 24. The molding layer 25 may be separated from the electrical connectors 23 below the semiconductor dies 22 and 22' by the underfill element 24. The molding layer 25 may be made of or include an insulating material such as a molding material. The molding material may include a polymer material, such as an epoxy-based resin with fillers dispersed therein. In some embodiments, a molding material (such as a liquid molding material) is dispensed over the interposer substrate 21 and/or over the semiconductor dies 22 and 22'. In some embodiments, a thermal process is then used to cure the liquid molding material and to transform it into the molding layer 25.

In some embodiments, a planarization process (not shown) is further applied on the molding layer 25 to partially remove the molding layer 25, until the top surfaces of the semiconductor dies 22 and 22' are exposed from the molding layer 25 (for example, the top surfaces of semiconductor dies 22 and 22' are substantially flush with the top surface of the molding layer 25). This can facilitate the dissipation of heat generated from the semiconductor dies 22 and 22' during operation. The planarization process may include a grinding process, a chemical mechanical polishing (CMP) process, an etching process, a dry polishing process, one or more other applicable processes, or a combination thereof.

After manufacturing, the above-mentioned package component 20 (including the interposer substrate 21, the semiconductor dies 22 and 22', the electrical connectors 23, the underfill element 24, and the molding layer 25) can be placed in a desired location above the surface 10A of the package substrate 10 using, for example, a pick-and-place tool (not shown). In some embodiments, the package component 20 is located centrically with respect to the package substrate 10, although the package component 20 may also be located eccentrically with respect to the package substrate 10 depending on design requirements (such as consideration of space arrangements).

The package component 20 is further bonded to the package substrate 10 through conductive elements 26 (such as conductive pillars) formed on the contact pads (not shown) exposed at the surface 21B (the lower surface shown) of the interposer substrate 21 and conductive structures 27 (such as micro bumps each including a metal pillar 27A and a metal cap layer 27B (such as a solder cap) over the metal pillar 27A) formed on the contact pads (not shown) exposed at the surface 10A of the package substrate 10, in accordance with some embodiments. The materials and formation method of the conductive elements 26 and the conductive structures 27 are well known in the art and therefore not described herein. In some embodiments, the package component 20 is bonded to the package substrate 10 through a reflow process. During the reflow, the conductive joints (including the conductive elements 26 and the conductive structures 27) are in contact with the exposed contact pads of the interposer substrate 21 and the exposed contact pads of the package substrate 10, respectively, to physically and electrically connect the package component 20 (or the interposer substrate 21) to the package substrate 10.

In some embodiments, an underfill element 28 is also formed over the surface 10A of the package substrate 10 to surround and protect the above conductive joints, and enhance the connection between the package component 20 and the package substrate 10. The underfill element 28 may be made of or include an insulating material such as an underfill material, similar to the underfill element 24 described above. In some embodiments, an underfill material in liquid state is dispensed into the gap between the interposer substrate 21 and the package substrate 10 to reinforce the strength of the conductive joints and therefore the overall package structure. After the dispensing, the underfill material is cured to form the underfill element 28. In some embodiments, as shown in FIG. 2A, the formed underfill element 28 extends laterally beyond the periphery of the package component 20, but the disclosure is not limited thereto.

In some embodiments, the ring structure 30 is disposed over the surface 10A of the package substrate 10. The ring structure 30 may have opposite surfaces 30A and 30B, and the (bottom) surface 30A faces the surface 10A, as shown in FIGS. 2A-2C. The ring structure 30 may have a rigidity greater than that of the package substrate 10, and may be configured as a stiffener ring for constraining the package substrate 10 to alleviate its warpage and/or to enhance robustness of the package substrate 10. The material of the ring structure 30 may include metal such as copper, stainless steel, stainless steel/Ni, or the like, but is not limited thereto.

In some embodiments, the ring structure 30 can be placed (for example, using a pick-and-place tool, not shown) over the surface 10A, and is arranged along the periphery of the package substrate 10 to surround the package component 20 (as well as the semiconductor dies 22 and 22'). For example, the outer edge 30C of the ring structure 30 may be aligned with the periphery 10C of the package substrate 10, and the inner edge 30D of the ring structure 30 is adjacent to the package component 20, as shown in FIG. 2A. The ring structure 30 may have a substantially rectangular (or square) ring shape in a top view (see FIG. 1), depending on the shape of the package substrate 10.

In some embodiments, as shown in FIG. 1 (see also FIG. 3), the rectangular ring structure 30 has four corner areas (or parts) 31 and four side areas (or parts) 32. Two opposite side areas 32 extend in the first (horizontal) direction $D_1$ in which the semiconductor dies 22 and 22' are arranged, and the other two opposite side areas 32 extend in a second (horizontal) direction $D_2$ that is perpendicular to the first direction $D_1$. Any two of the corner areas 31 are separated from one another by one of the side areas 32.

In some embodiments, the ring structure 30 is attached to the package substrate 10 using the adhesive layer 40 interposed between the (bottom) surface 30A of the ring structure 30 and the surface 10A of the package substrate. The adhesive layer 40 may be any suitable non-conductive adhesive, epoxy, die attach film (DAF), or the like, and may be applied to the surface 30A of the ring structure 30 or may be applied over the surface 10A of the package substrate 10, in some embodiments.

The above-mentioned various package components and substrate materials used in the semiconductor die package 1 may have different coefficient of thermal expansions (CTEs). Hence, when the package undergoes thermal cycling during package assembly, reliability testing, or field operation, the package components and substrate materials may expand at different rates, causing the package substrate 10 tends to warp. The ring structure 30 may reduce some extent this warpage, but since the ring structure 30 constrains the package substrate 10, this constraining force produces stress in the package substrate 10. It has been observed that the generated stress is typically concentrated in die corner areas CA and die-to-die areas DA of the package (see FIG. 1), which will cause cracks to easily occur in the used underfill element(s) and/or the used molding layer (e.g., the underfill element 24, the underfill element 28, and/or the molding layer 25) corresponding to these areas, thereby inducing the reliability issues.

Therefore, what is needed is a semiconductor die package having a ring structure that can address the above issue of stress concentration in specific areas (especially in the die corner areas CA and the die-to-die areas DA) of the package. The following will describe a novel ring structure with a fin-shaped design provided in accordance with some embodiments, which can be used to relieve stress generated in these areas of the package during thermal cycling.

Figure 3:
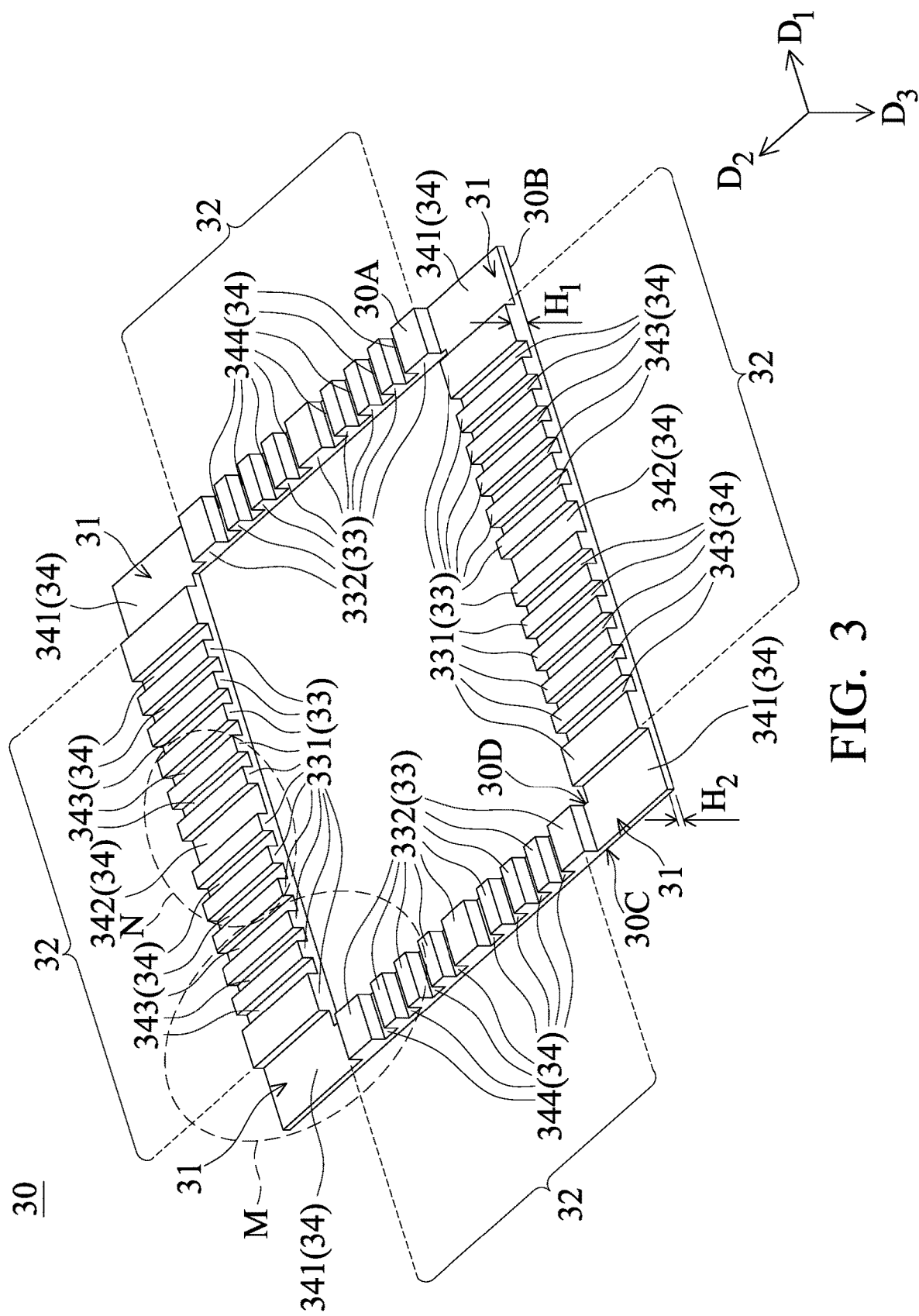
FIG. 3 is a perspective view of the ring structure in FIGS. 1 and 2A-2C, showing the profile of its bottom surface.

FIG. 3 is a perspective view of the ring structure 30 in FIGS. 1 and 2A-2C, showing the profile of its (bottom) surface 30A. As shown in FIG. 3, the ring structure 30 has a fin profile (i.e., non-flat) on the surface 30A, in accordance with some embodiment. The profile of the adhesive layer 40 matches the (fin) profile of the surface 30A of the ring structure 30 (for example, the adhesive layer 40 partially extends into recessed parts formed on the surface 30A), as shown in FIGS. 2A-2C.

In some embodiments, the ring structure 30 includes a first part having a first height $H_1$ (in the vertical direction $D_3$ perpendicular to the first direction $D_1$ and the second direction $D_2$) and a second part recessed from the surface 30A and having a second height $H_2$ (in the vertical direction $D_3$) that is lower than the first height $H_1$. In some embodiments, the different between the first height $H_1$ and the second height $H_2$ is greater than about ⅙ of the first height $H_1$ (i.e., $H1-H2>\frac{1}{6}*H1$) to achieve a better stress reduction effect (for example, reduce the stress by about 10% relative to a traditional ring structure with a flat bottom surface). In some embodiments, the second height $H_2$ is greater than about ⅓ of the first height $H_1$ (i.e., $H2>\frac{1}{3}*H1$) to maintain the ability of the ring structure 30 to control warpage. The recessed second part can be formed in the ring structure 30 using a mechanical process such as a punching process, a chemical process such as an etching process, laser ablation, or the like, in accordance with some embodiments.

In some embodiments, the first part of the ring structure 30 includes a plurality of higher parts 33 arranged in each side area 32 of the ring structure 30, each higher part 33 having the first height $H_1$. For example, the higher parts 33 include a plurality of first higher parts 331 arranged side by side in the two opposite side areas 32 extending in the first direction $D_1$, and a plurality of second higher parts 332 arranged side by side in the two opposite side areas 32 extending in the second direction $D_2$, as shown in FIG. 3. Each first higher part 331 extends from the outer edge 30C to the inner edge 30D of the ring structure 30 in the second direction $D_2$, and each second higher part 332 extends from the outer edge 30C to the inner edge 30D of the ring structure 30 in the first direction $D_1$, in accordance with some embodiments.

In some embodiments, the second part of the ring structure 30 includes a plurality of lower parts 34 arranged between the higher parts 33, each lower part 34 having the second height $H_2$. The lower parts 34 include a plurality of (e.g., four) first lower parts 341 arranged in each corner area 31 of the ring structure 30, in accordance with some embodiments. For example, each first lower part 341 is interposed between one higher part 331 and one higher part 332 (in two adjacent side areas 32 of the ring structure 30) adjacent to the respective corner area 31, as shown in FIG. 3. The first lower parts 341 (and the corner areas 31) correspond to the die corner areas CA (in FIG. 1) of the package, in accordance with some embodiments. In some embodiments, each first lower part 341 is immediately adjacent to the outer edge 30C of the ring structure 30.

Figure 4A:
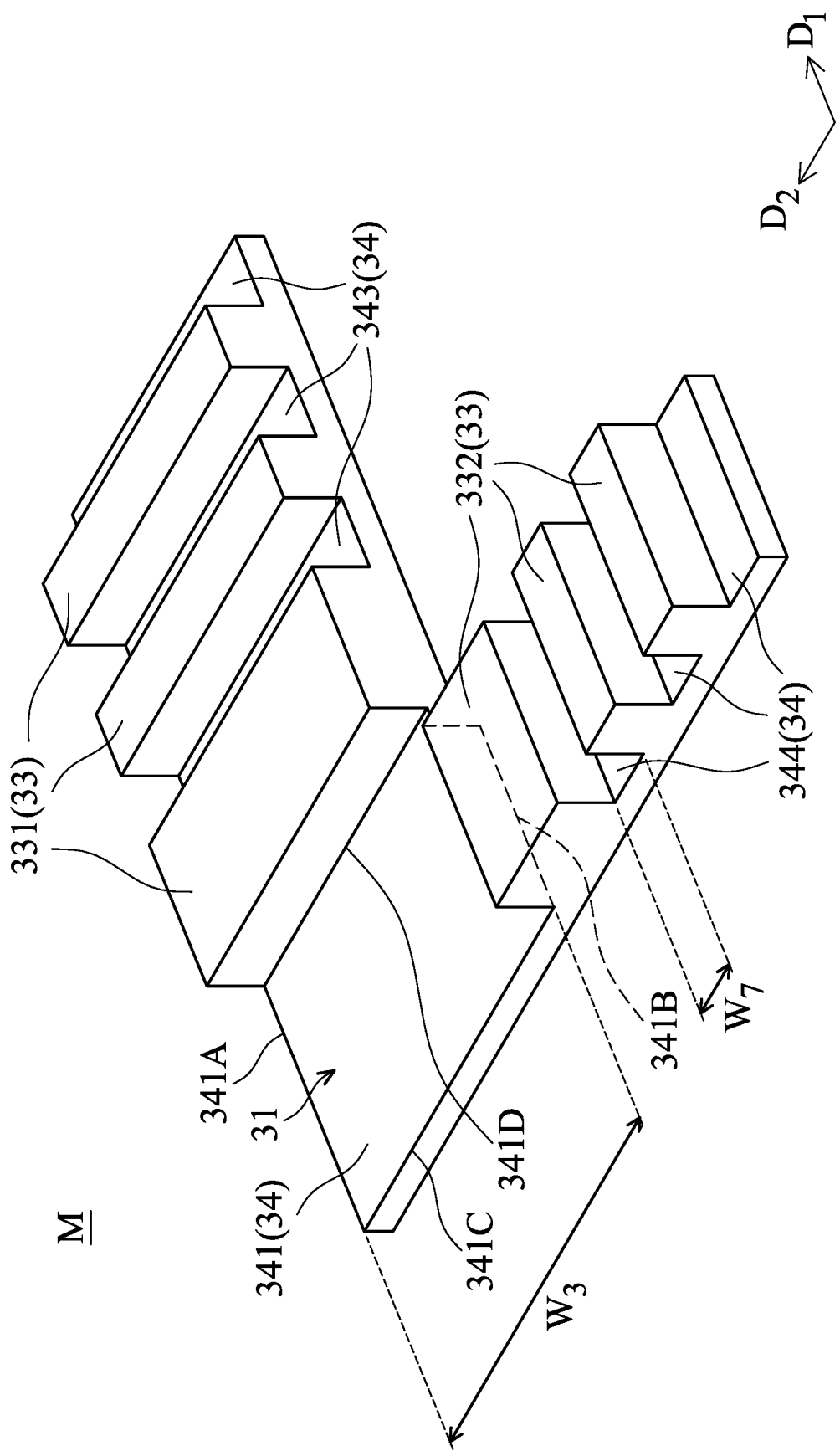
FIG. 4A illustrates a part M of the ring structure in FIG. 3.

FIG. 4A illustrates a part M of the ring structure 30 in FIG. 3. In FIG. 4A, a first lower part 341 has a first outer lateral edge 341A parallel to the first direction $D_1$, a first inner lateral edge 341B connected to one higher part 332 and opposite the first outer lateral edge 341A, a second outer lateral edge 341C parallel to the second direction $D_2$, and a second inner lateral edge 341D connected to one higher part 331 and opposite the second outer lateral edge 341C. The (four) first lower parts 341 of the ring structure 30 may have the same shape and size.

Figure 5A:
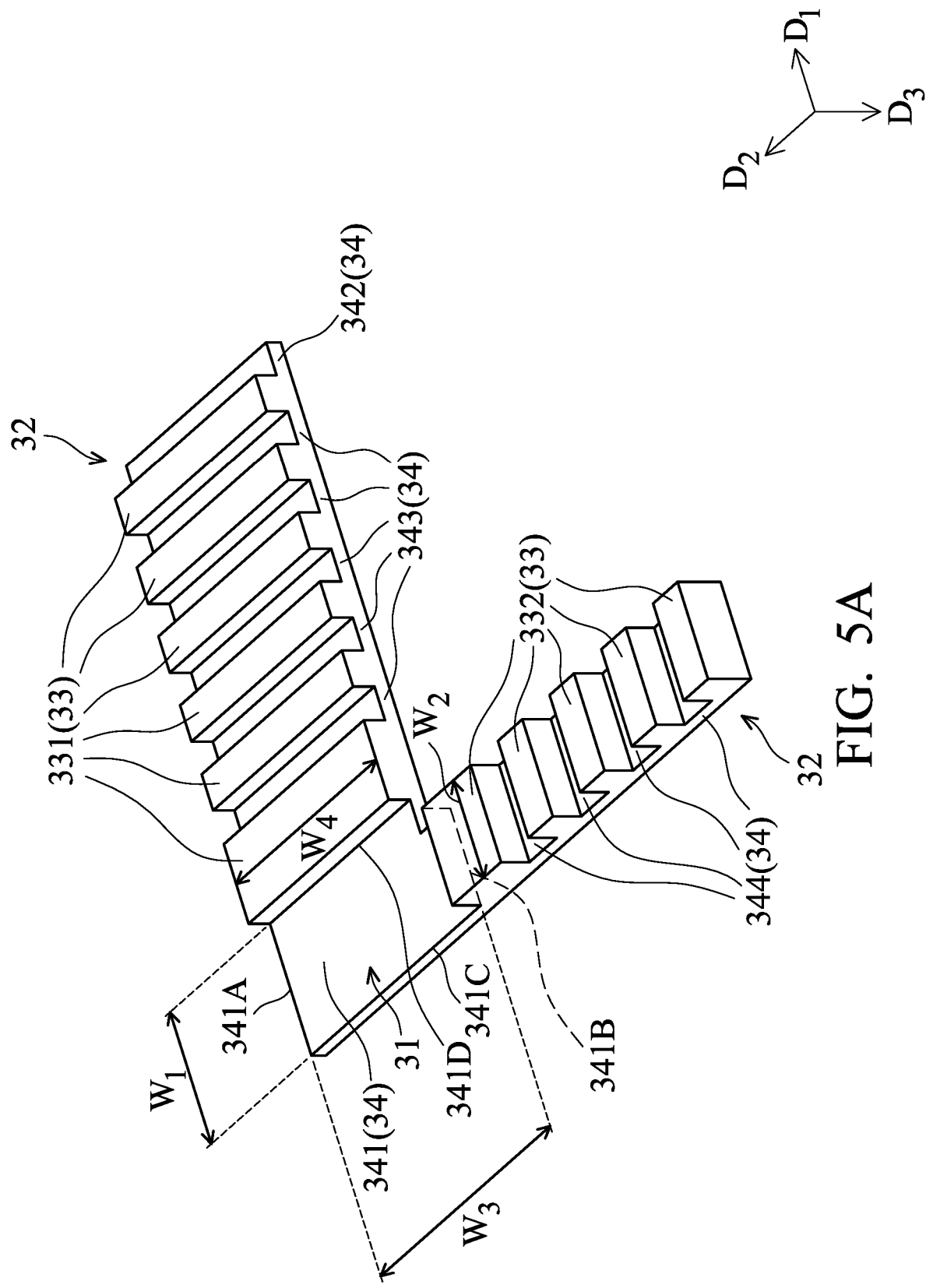
FIG. 5A is a perspective view of a portion of a ring structure in accordance with some embodiments.
Figure 5B:
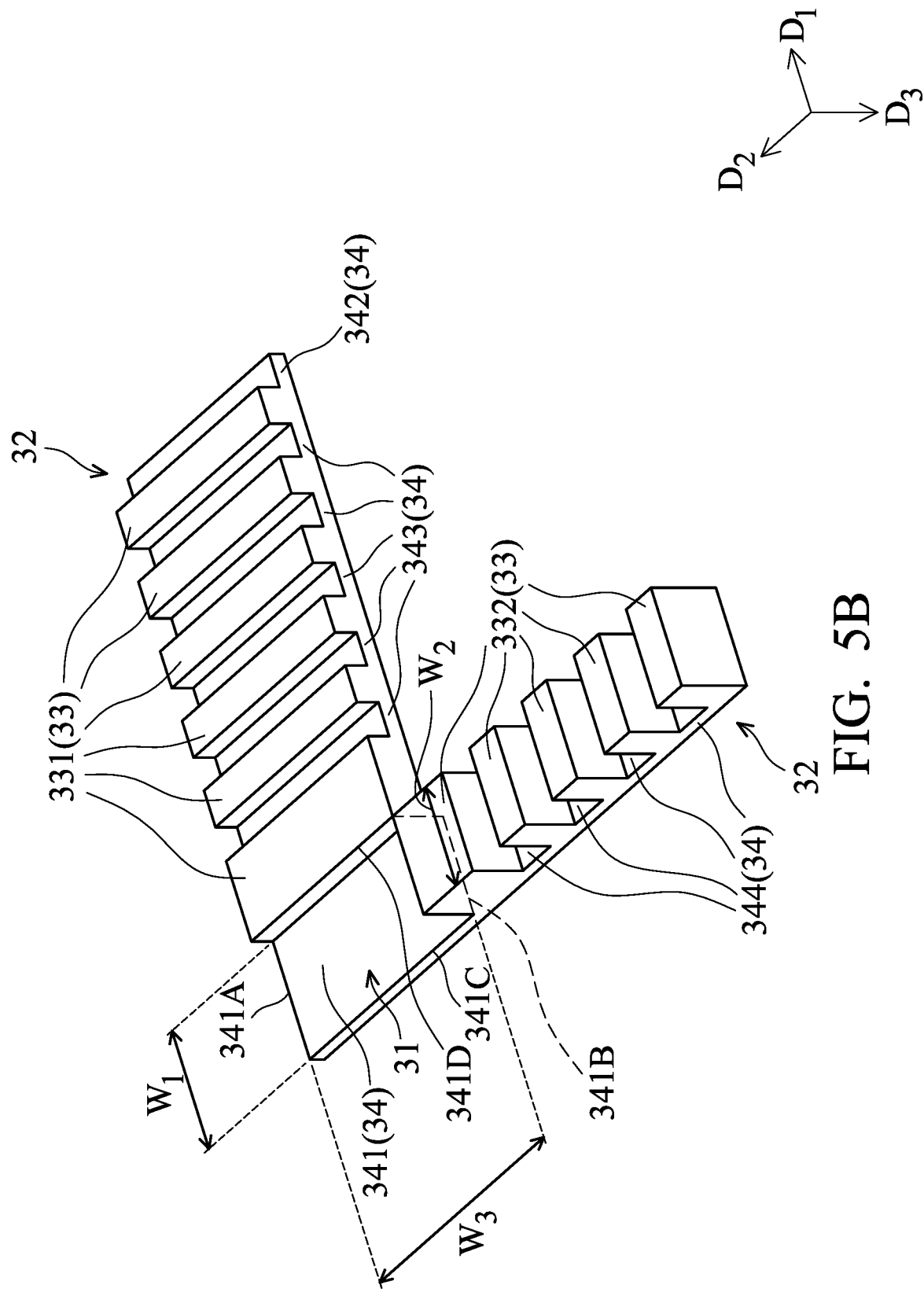
FIG. 5B is a perspective view of a portion of a ring structure in accordance with some embodiments.

FIGS. 5A and 5B illustrate various sizes (or shapes) of the first lower part 341 in accordance with some embodiments. In FIG. 5A, the first lower part 341 is L-shaped. The width $W_1$ of the first outer lateral edge 341A in the first direction $D_1$ is greater than the width $W_2$ of the higher part 332 connected to the first inner lateral edge 341B in the first direction $D_1$, and the width $W_3$ of the second outer lateral edge 341C in the second direction $D_2$ is greater than the width $W_4$ of the higher part 331 connected to the second inner lateral edge 341D in the second direction $D_2$. In FIG. 5B, the first lower part 341 is rectangular. The width $W_1$ is equal to the width $W_2$, and the width $W_3$ is equal to the width $W_4$.

By providing or forming the first lower parts 341 in the ring structure 30 as described above, the mechanical coupling effect and the CTE mismatch between the corner areas 31 of the ring structure 30 and the underlying package substrate 10 can be reduced. Accordingly, it helps to prevent or reduce stress concentration or cracking in the die corner areas CA (in FIG. 1) of the package caused by the ring structure 30.

It should be appreciated that the larger the size of each first lower part 341 (for example, the size of the first lower part 341 in FIG. 5A>in FIG. 5B), the better the effect of reducing stress concentration (in the used underfill element(s) and/or the used molding layer) in the die corner areas CA of the package, but this may sacrifice the ability of the ring structure 30 to control warpage.

In some embodiments, the lower parts 34 of the ring structure 30 also include a plurality of (e.g., two) second lower parts 342 arranged in the opposite side areas 32 of the ring structure 30 extending in the first direction $D_1$ and aligned with the portion 240 (in FIGS. 1 and 2A) of the underfill element 24 between the adjacent semiconductor dies 22 and 22'. For example, each second lower part 342 is interposed between two higher parts 331 in one side area 32 of the ring structure 30 extending in the first direction $D_1$, and extends from the outer edge 30C to the inner edge 30D of the ring structure 30 in the second direction $D_2$ (that is, the second lower parts 342 and the higher parts 331 extending in the second direction $D_2$ are parallel to each other and have the same length), as shown in FIG. 3 (see also FIG. 4B, which illustrates a part N of the ring structure 30 in FIG. 3). Also, the second lower parts 342 correspond to the portion 240 of the underfill element 24, such as being aligned with the portion 240 in the second direction $D_2$.

In some embodiments, the width $W_5$ (see FIG. 4B) of each second lower part 342 in the first direction $D_1$ is greater than the width X (see FIGS. 1 and 2A) of the portion 240 of the underfill element 24 in the first direction $D_1$, but the disclosure is not limited thereto. For example, the width $W_5$ may be equal to or less than the width X in some other embodiments.

By providing or forming the second lower parts 342 in the ring structure 30 as described above, the mechanical coupling effect and the CTE mismatch between part of the side areas 32 (corresponding to the portion 240 of the underfill element 24) of the ring structure 30 and the underlying package substrate 10 can be reduced. Accordingly, it helps to prevent or reduce stress concentration or cracking in the used underfill element(s) and/or the used molding layer in the die-to-die areas DA (in FIG. 1) of the package caused by the ring structure 30.

It should be appreciated that the larger the size (such as the width $W_5$) of each second lower part 342, the better the effect of reducing stress concentration in the die-to-die areas DA of the package. For example, in cases where the width $W_5$ of each second lower part 342 is greater than 40 times the width X of the portion 240 (i.e., $W_5>40*X$), the stress generated in the die-to-die areas DA of the package during thermal cycling can be reduced by about 10% relative to a ring structure without the second lower parts 342. However, as the width $W_5$ of each second lower part 342 increases, the ring structure 30 is less able to control warpage. In some embodiments, the width $W_5$ of each second lower part 342 in the first direction $D_1$ does not exceed the width $X_1$ (see FIG. 1) of each semiconductor die 22/22' in the first direction $D_1$.

In some embodiments, the lower parts 34 of the ring structure 30 further include a plurality of third lower parts 343 and fourth lower parts 344 in addition to the first and second lower parts 341 and 342. In some embodiments, the third lower parts 343 are arranged between the first and second lower parts 341 and 342 in the first direction $D_1$, and are interposed between some higher parts 331 arranged in the opposite side areas 32 extending in the first direction $D_1$, as shown in FIG. 3. Each third lower part 343 extends from the outer edge 30C to the inner edge 30D of the ring structure 30 in the second direction $D_2$ (that is, the third lower parts 343, the second lower parts 342, and the higher parts 331 extending in the second direction $D_2$ are parallel to each other and have the same length), in accordance with some embodiments.

Figure 4B:
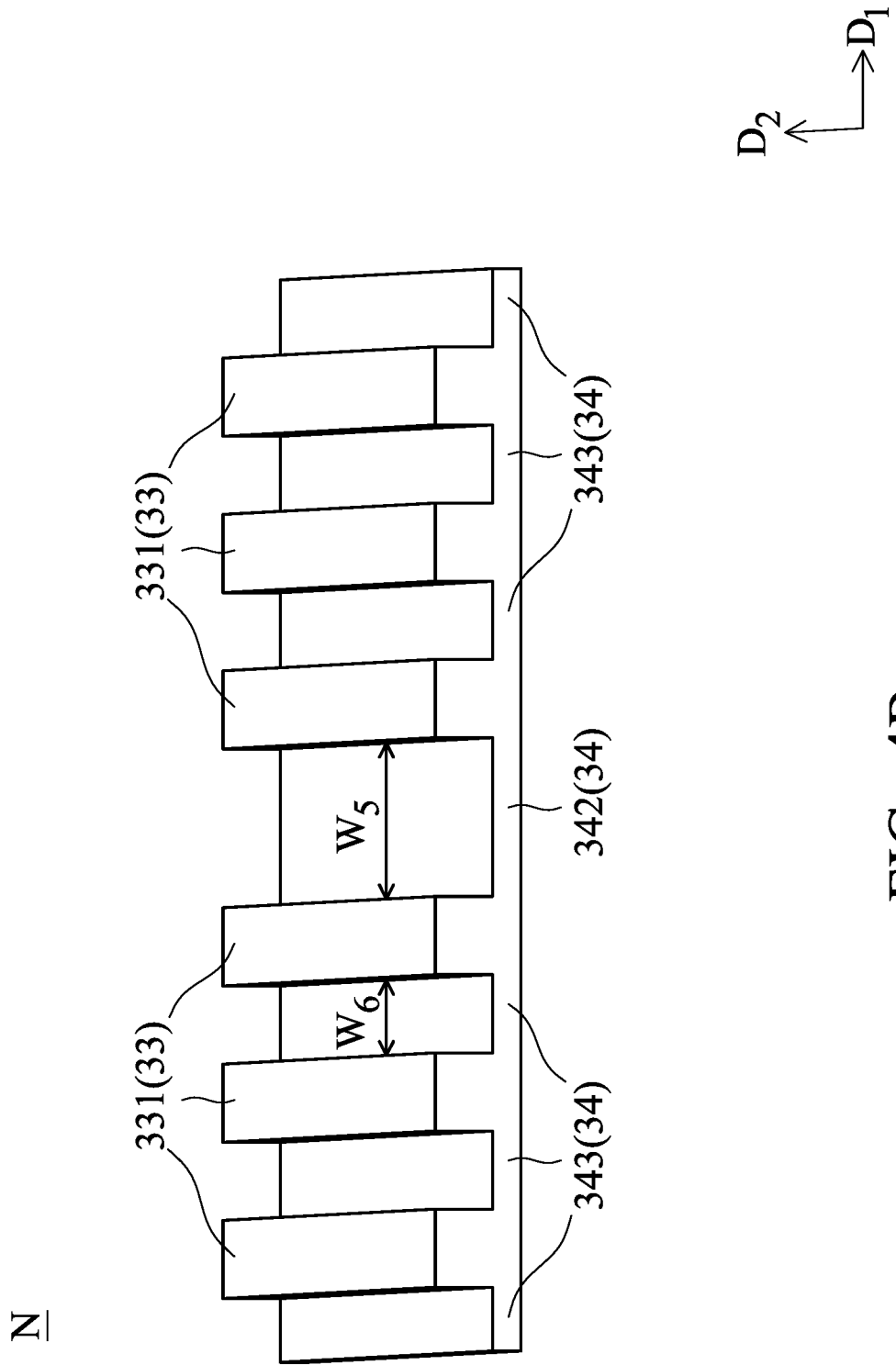
FIG. 4B illustrates a part N of the ring structure in FIG. 3.

In some embodiments, the width $W_5$ of each second lower part 342 in the first direction $D_1$ is greater than the width $W_6$ of each third lower part 343 in the first direction $D_1$, as shown in FIG. 4B. In some embodiments, the width $W_6$ of each third lower part 343 in the first direction $D_1$ is greater than the width X (see FIGS. 1 and 2A) of the portion 240 of the underfill element 24 in the first direction $D_1$, although the width $W_6$ may also be equal to or less than the width X in different embodiments.

In some embodiments, the fourth lower parts 344 are arranged between the first lower parts 341 in the second direction $D_2$, and are interposed between some higher parts 332 arranged in the opposite side areas 32 extending in the second direction $D_2$, as shown in FIG. 3. Each fourth lower part 344 extends from the outer edge 30C to the inner edge 30D of the ring structure 30 in the first direction $D_1$ (that is, the fourth lower parts 344 and the higher parts 332 extending in the first direction $D_1$ are parallel to each other and have the same length), in accordance with some embodiments.

In some embodiments, the width $W_3$ of the second outer lateral edge 341C of each first lower part 341 in the second direction $D_2$ is greater than the width $W_7$ of each fourth lower part 344 in the second direction $D_2$, as shown in FIG. 4A. In some embodiments, the width $W_3$ does not exceed the width $X_2$ (see FIG. 1) of each semiconductor die 22/22' in the second direction $D_2$.

It should be appreciated that the third and fourth lower parts 343 and 344 can further reduce the mechanical coupling effect and the CTE mismatch between the entire ring structure 30 and the underlying package substrate 10, thereby preventing or reducing stress issues caused by the ring structure 30 during thermal cycling.

Figure 3A:
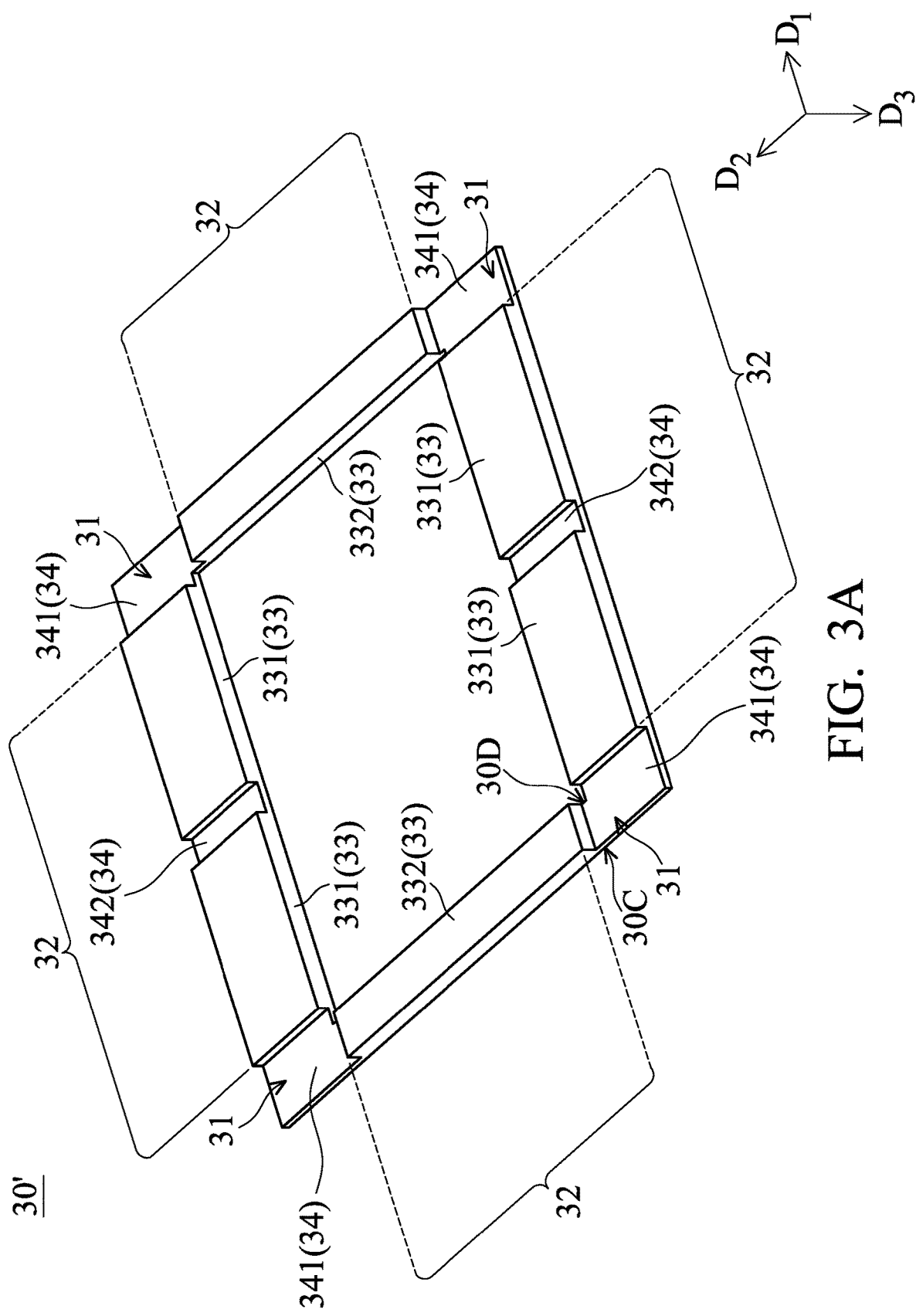
FIG. 3A is a perspective view of a ring structure in accordance with some embodiments, showing the profile of its bottom surface.

In some other embodiments, the lower parts 34 of the ring structure 30' may only include the first and second lower parts 341 and 342 (i.e., the third and fourth lower parts 343 and 344 can be omitted), as shown in FIG. 3A. The configuration of the first and second lower parts 341 and 342 in FIG. 3A may be the same as or similar to those in FIG. 3, and are not repeated here.

Figure 6:
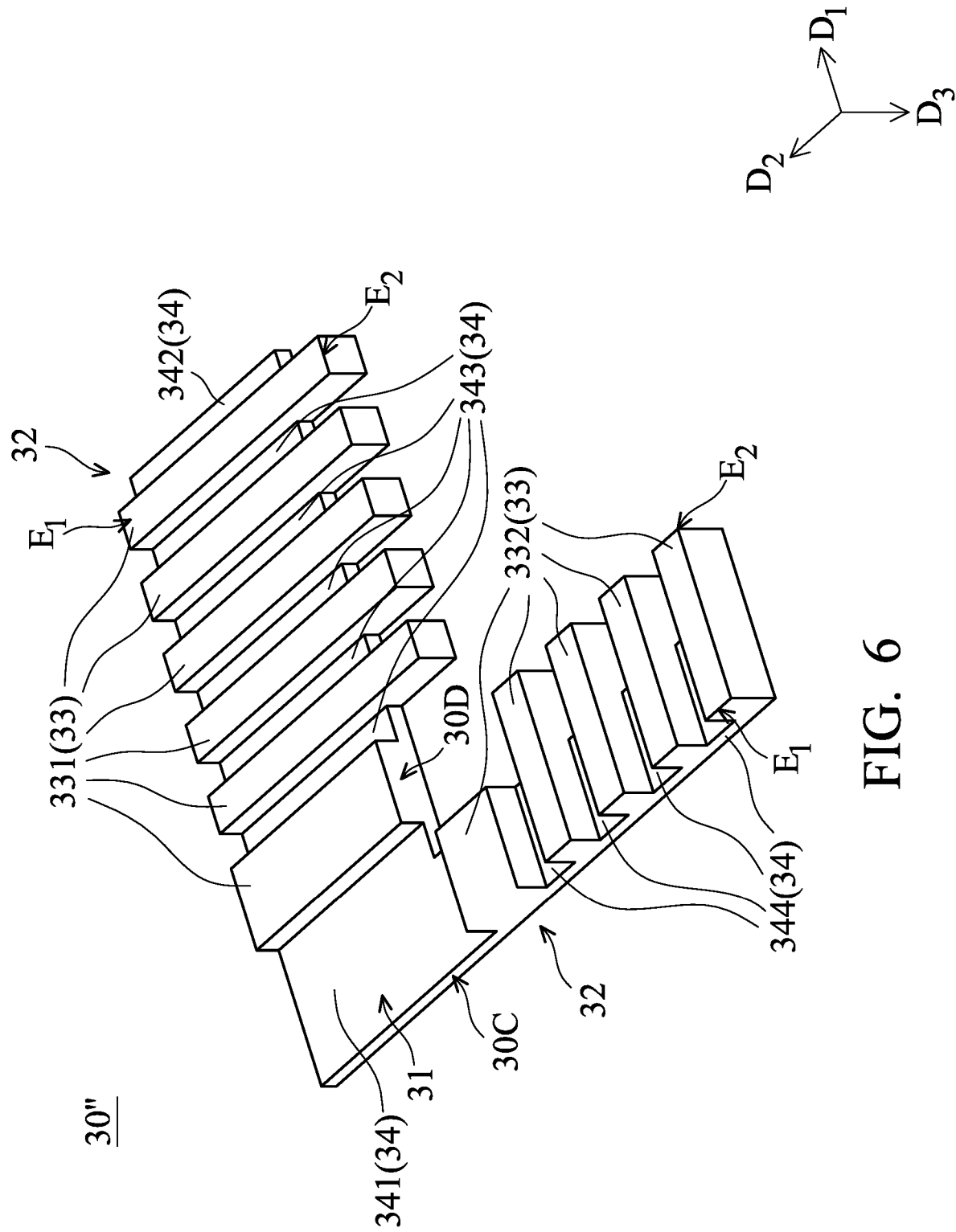
FIG. 6 is a perspective view of a portion of a ring structure in accordance with some embodiments.

Many variations and/or modifications can be made to embodiments of the disclosure. For example, FIG. 6 is a perspective view of a portion of a ring structure 30''' in accordance with some other embodiments (a complete ring structure 30'' is similar to the ring structure 30 in FIG. 3, with four corner areas 31 and four side areas 32). It should be appreciated that most of the configurations in FIG. 6 are the same as those in FIG. 3, so only the different parts are described here. In FIG. 6, some higher parts 331 and 332 of the ring structure 30'' respectively have a first end $E_1$ aligned with the outer edge 30C of the ring structure 30'' and a second end $E_2$ protruding from the inner edge 30D of the ring structure 30''. The higher parts 331 and 334 can be integrally formed with the corner parts and the side parts of the ring structure 30'' using any suitable techniques. Some higher parts 331 and 332 protruding from the inner edge 30D can increase the structural strength of the entire ring structure 30'', thereby improving its ability to control warpage.

Figure 7:
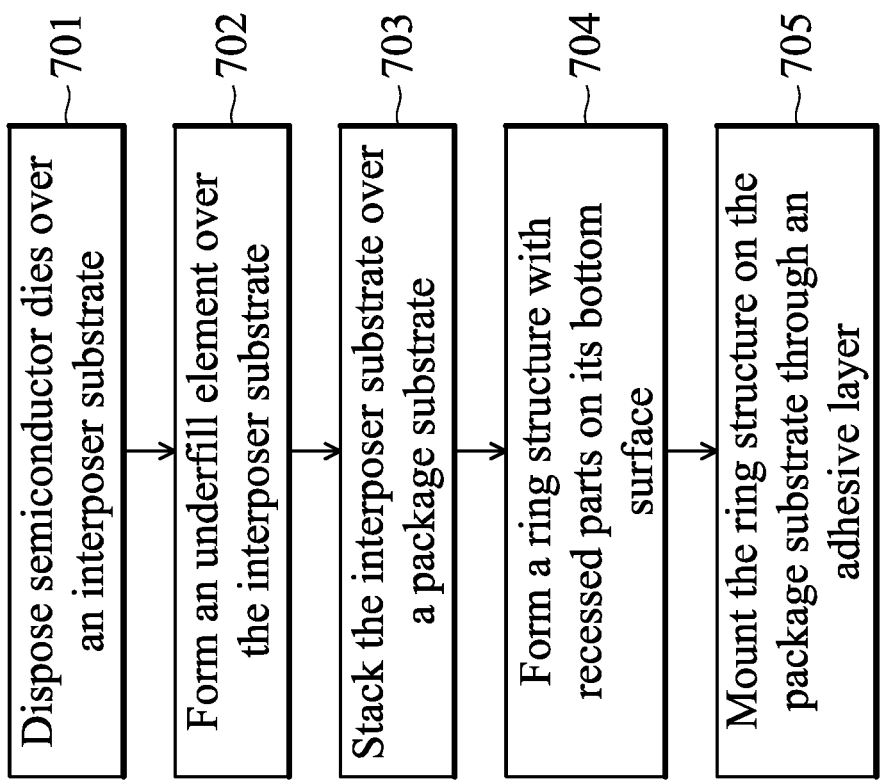
FIG. 7 is a flow chart illustrating a method for forming a semiconductor die package in accordance with some embodiments.

FIG. 7 is a flow chart illustrating a method 700 for forming a semiconductor die package in accordance with some embodiments. For illustration, the flow chart will be described along with the drawings shown in FIGS. 1 to 6. The method 700 includes operation 701, in which the semiconductor dies 22 and 22' are disposed over the (upper) surface 21A of the interposer substrate 21, such as by using a pick-and-place tool (not shown). Afterwards, the electrical connectors 23 between the semiconductor dies 22 and 22' and the interposer substrate 21 are reflowed as previously discussed in FIG. 2A, to electrically connect the semiconductor dies 22 and 22' to the interposer substrate 21.

The method 700 also includes operation 702, in which the underfill element 24 is formed over the surface 21A of the interposer substrate 21 to surround and protect the above electrical connectors 23 and the semiconductor dies 22 and 22' as previously discussed in FIG. 2A. In some embodiments, a portion 240 of the underfill element 24 extends into the gap G1 between the semiconductor dies 22 and 22'.

The method 700 also includes operation 703, in which the interposer substrate 21 (and the above semiconductor dies 22 and 22' and the underfill element 24) is stacked over the (upper) surface 10A of the package substrate 10, such as by using a pick-and-place tool (not shown). Afterwards, the electrical joints between the interposer substrate 21 and the package substrate 10 are reflowed as previously discussed in FIG. 2A, to electrically connect the interposer substrate 21 to the package substrate 10.

The method 700 also includes operation 704, in which recessed parts (such as the lower parts 34 described above) are formed on (or recessed from) the (bottom) surface 30A of a ring structure 30 (or 30', 30'') using, for example, a punching process, another mechanical process, a chemical etching process, a laser ablation process, or another applicable process. The recessed parts are interposed between a plurality of higher parts 33 as previously discussed in FIGS. 3, 4A, and 4B. In some embodiments, the recessed parts include a plurality of first recessed parts (e.g., the first lower parts 341) arranged in each corner area 31 of the ring structure 30 (or 30', or 30'') and two second recessed parts (e.g., the second lower parts 342) arranged in two opposite side areas 32 of the ring structure 30 (or 30', or 30'') and aligned with the portion 240 of the underfill element 24 between the semiconductor dies 22 and 22', as shown in FIGS. 3, 3A, and 6. In some embodiments, the recessed parts further include a plurality of third recessed parts (e.g., the third lower parts 343) arranged in two opposite side areas 32 of the ring structure 30 (or 30', or 30'') and between one first recessed part and one second recessed part. Also, the recessed parts further include a plurality of fourth recessed parts (e.g., the fourth lower parts 344) arranged in the other two opposite side areas 32 of the ring structure 30 (or 30', or 30'') and between two first recessed parts. The structure of the recessed parts has been described in detail above, and this description is not repeated here.

In addition, the method 700 further includes operation 705, in which the ring structure 30 (or 30', or 30'') is mounted on the surface 10A of the package substrate 10 via the adhesive layer 40 to surround the semiconductor dies 22 and 22'. The adhesive layer 40 may be applied to the surface 30A of the ring structure 30 (or 30', or 30'') or may be applied over the surface 10A of the package substrate 10 before installing the ring structure 30 (or 30', or 30'') on the surface 10A, in accordance with some embodiments. After installation, the adhesive layer 40 partially extends into the recessed parts on the (bottom) surface 30A of the ring structure 30 (or 30', or 30''), as shown in FIGS. 2B and 2C.

Through the above method 700, a semiconductor die package 1 (in FIGS. 1 and 2A-2C) with a novel fin type ring structure 30 (or 30', or 30'') is manufactured.

Figure 8A:
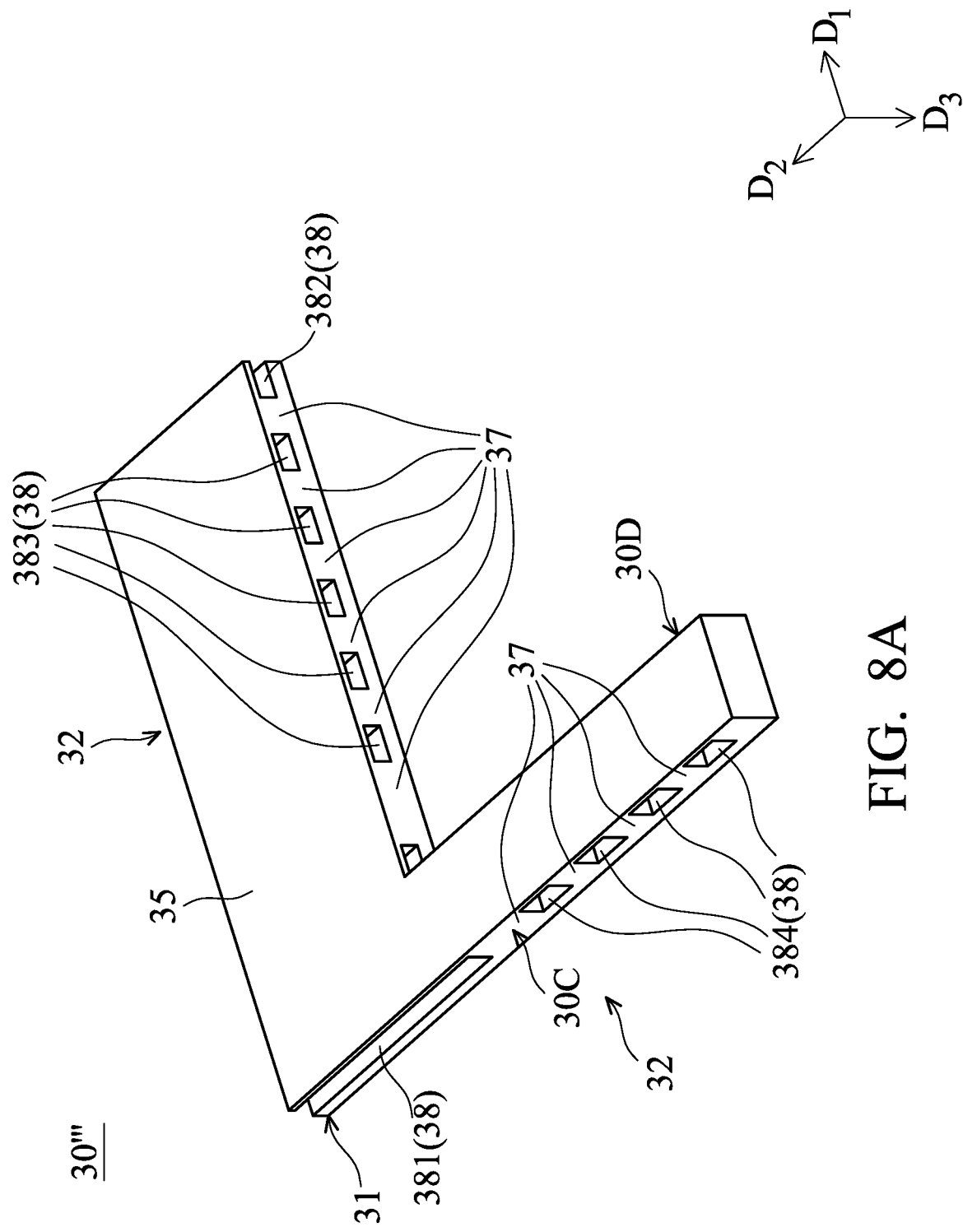
FIG. 8A is a perspective view of a portion of a ring structure in accordance with some embodiments.
Figure 8B:
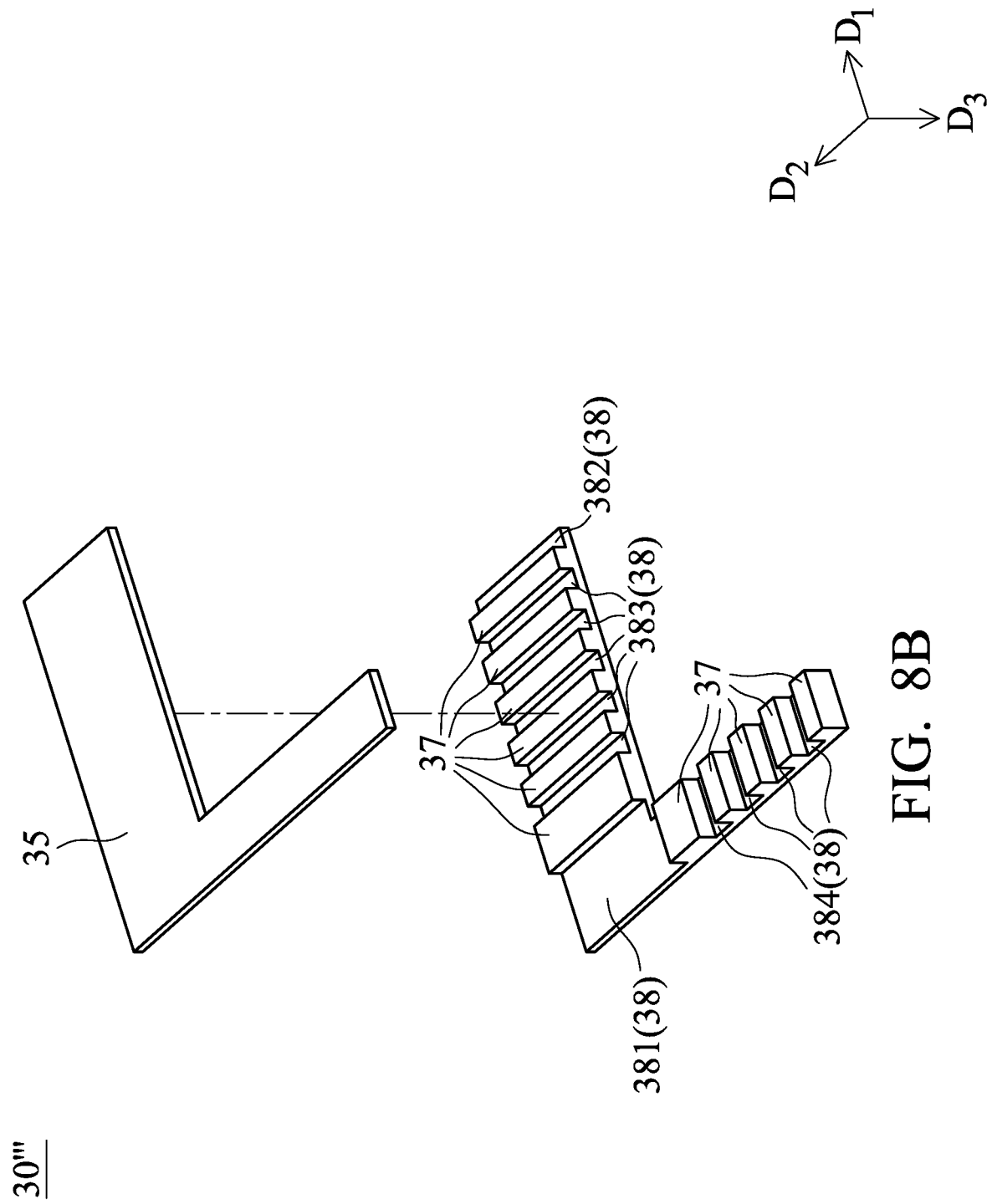
FIG. 8B is an exploded view of the ring structure in FIG. 8A.
Figure 9:
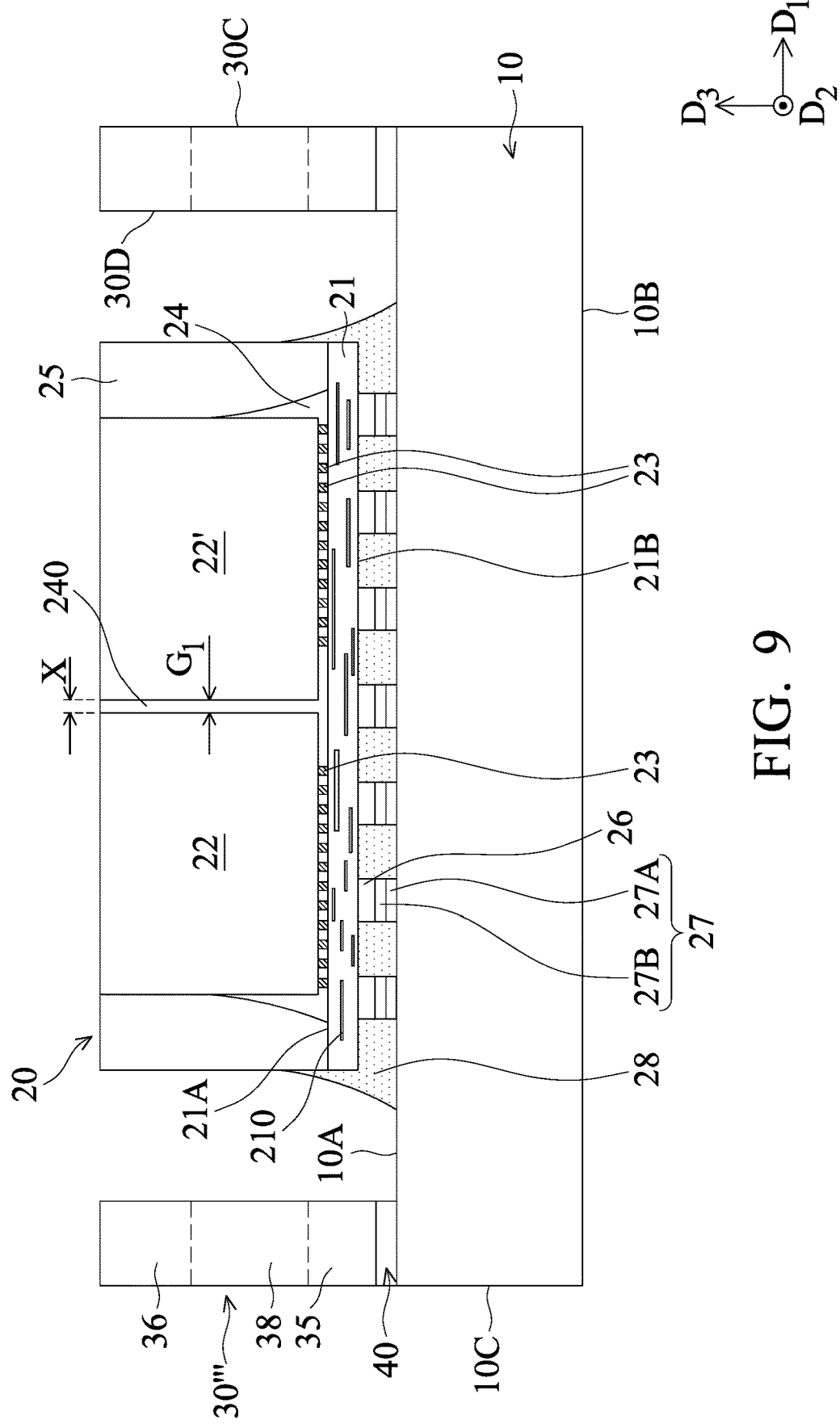
FIG. 9 is a schematic cross-sectional view of a semiconductor die package using the ring structure in FIG. 8A in accordance with some embodiments.

FIG. 8A illustrates a portion of a hollow type ring structure 30''' in accordance with some other embodiments (a complete ring structure 30''' is similar to the ring structure 30 in FIG. 3, with four corner areas 31 and four side areas 32). FIG. 8B is an exploded view of the ring structure 30''' in FIG. 8A. FIG. 9 is a schematic cross-sectional view of a semiconductor die package 2 using the ring structure 30''' in FIG. 8A in accordance with some embodiments. It should be appreciated that most of the structures in FIG. 9 are the same as those in FIG. 2A, so only the different parts (related to the ring structure 30''') are described here. In FIGS. 8A, 8B, and 9, the ring structure 30''' includes a first flat plate 35 to be attached (via an adhesive layer 40) to the surface 10A of the package substrate 10, a second flat plate 36 opposite the first flat plate 35, a plurality of connection parts 37 connecting the first and second flat plates 35 and 36, and a plurality of hollow parts 38 between the first flat plate 35, the second flat plate 36, and the connection parts 37.

In some embodiments, the connection parts 37 are arranged side by side in each side area 32 of the ring structure 30''', and extend from the outer edge 30C to the inner edge 30D of the ring structure 30''', similar to the higher parts 33 as previously discussed in FIGS. 3, 4A, and 4B.

In some embodiments, the hollow parts 38 are located between the connection parts 37, and extend from the outer edge 30C to the inner edge 30D of the ring structure 30''', similar to the lower parts 34 as previously discussed in FIGS. 3, 4A, and 4B. For example, the hollow parts 38 include a plurality of first hollow parts 381 (only one is depicted) arranged in each corner area 31 of the ring structure 30''' and two second hollow parts 382 (only one is depicted) arranged in two opposite side areas 32 (for example, the side areas 32 extending in the first direction $D_1$) of the ring structure 30''' and aligned with the portion 240 of the underfill element 24 between the semiconductor dies 22 and 22' (in the second direction $D_2$, for example), in accordance with some embodiments. The locations and sizes of the first and second hollow parts 381 and 382 may be the same as or similar to the first and second lower parts 341 and 342 illustrated in FIGS. 3, 4A, and 4B, and are not repeated here.

In some embodiments, the hollow parts 38 further include a plurality of third hollow parts 383 arranged in two opposite side areas 32 (for example, the side areas 32 extending in the first direction $D_1$) of the ring structure 30''' and between one first hollow part 381 and one second hollow part 382 (and each third hollow part 383 is located between two connection parts 37), and the hollow parts 38 further include a plurality of fourth hollow parts 384 arranged in the other two opposite side areas 32 (for example, the side areas 32 extending in the second direction $D_2$) of the ring structure 30''' and between two first hollow parts 381 (and each fourth hollow part 384 is located between two connection parts 37). The locations and sizes of the third and fourth hollow parts 383 and 384 may be the same as or similar to the third and fourth lower parts 343 and 344 illustrated in FIGS. 3, 4A, and 4B, and are not repeated here.

It should be understood that the ring structure 30''' in FIG. 8 can be obtained by combining (e.g., through bonding) a fin type ring structure (such as the ring structure 30 in FIG. 3) with the first flat plate 35. The ring structure 30''' is mounted on the surface 10A of the package substrate 10 through the adhesive layer 40 interposed between the first flat plate 35 and the package substrate 10. In this case, the interface between the first flat plate 35 and the adhesive layer 40 is substantially flat. In other embodiments, the ring structure 30''' in FIG. 8 may be integrally formed as a whole.

The hollow type ring structure 30''' described above can also reduce the mechanical coupling effect and the CTE mismatch between certain areas of the ring structure 30''' and the underlying package substrate 10 (similar to the ring structure 30 discussed above), thereby preventing or reducing the stress concentration or cracking in the used underfill element(s) and/or the used molding layer corresponding to those areas of the package.

In some embodiments, the mentioned ring structures may includes connected segments or separate segments around the semiconductor dies or packages.

A semiconductor die package having a ring structure that prevent stress concentration is provided in accordance with some embodiments of the disclosure. The ring structure may be a fin or a hollow type ring structure including several stress reduction parts (for example, the lower parts recessed from the bottom surface or the hollow parts penetrating the ring structure as described above), which can relieve the stress generated in certain areas of the package during thermal cycling. Accordingly, it helps to prevent or reduce stress concentration or cracking in those areas of the package caused by the ring structure during thermal cycling. As a result, the reliability of the entire package structure may be improved.

In accordance with some embodiments, a method for forming a semiconductor die package is provided. The method includes disposing a first semiconductor die and a second semiconductor die over an interposer substrate, forming an underfill element over the interposer substrate to surround the first and second semiconductor dies, wherein a portion of the underfill element is between the first semiconductor die and the second semiconductor die, stacking the interposer substrate along with the first and second semiconductor dies and the underfill element over a package substrate, and installing a ring structure on the package substrate through an adhesive layer to surround the first and second semiconductor dies. The ring structure has a bottom surface facing the package substrate and a plurality of recessed parts recessed from the bottom surface. The recessed parts include a plurality of first recessed parts arranged in at least one corner area of the ring structure and two second recessed parts arranged in two opposite side areas of the ring structure. The portion of the underfill element between the first and the second semiconductor dies is disposed between the two second recessed parts.

In accordance with some embodiments, a method for forming a semiconductor die package is provided. The method includes disposing a first semiconductor die and a second semiconductor die over an interposer substrate, forming an underfill element over the interposer substrate to surround the first and second semiconductor dies, wherein a portion of the underfill element is between the first semiconductor die and the second semiconductor die, stacking the interposer substrate along with the first and second semiconductor dies and the underfill element over a package substrate, and installing a ring structure on the package substrate through an adhesive layer to surround the first and second semiconductor dies. The ring structure has a bottom surface facing the package substrate, and the ring structure includes a first part having a first height and a second part recessed from the bottom surface and having a second height that is lower than the first height. The first part includes a plurality of higher parts arranged side by side in each side area of the ring structure, and the second part comprises a plurality of lower parts between the higher parts. The lower parts include a plurality of first lower parts arranged in at least one corner area of the ring structure and two second lower parts arranged in opposite side areas of the ring structure and aligned with the portion of the underfill element. The adhesive layer is interposed between the bottom surface of the ring structure and the package substrate, wherein the adhesive layer partially extends into the lower parts.

In accordance with some embodiments, a method for forming a semiconductor die package is provided. The method includes disposing a first semiconductor die and a second semiconductor die over an interposer substrate, forming an underfill element over the interposer substrate to surround the first and second semiconductor dies, wherein a portion of the underfill element is between the first semiconductor die and the second semiconductor die, stacking the interposer substrate along with the first and second semiconductor dies and the underfill element over a package substrate, and installing a stress-relief structure on the package substrate through an adhesive layer to surround the first and second semiconductor dies. The stress-relief structure includes a first flat plate facing the package substrate, a second flat plate opposite the first flat plate, a plurality of connection parts connecting the first and second flat plates, and a plurality of hollow parts between the first flat plate, the second flat plate, and the plurality of connection parts. The hollow parts include a plurality of first hollow parts arranged in at least one corner area of the stress-relief structure. The adhesive layer is interposed between the first flat plate of the stress-relief structure and the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor die package, comprising:
    disposing a first semiconductor die and a second semiconductor die over an interposer substrate;
    forming an underfill element over the interposer substrate to surround the first and second semiconductor dies, wherein a portion of the underfill element is between the first semiconductor die and the second semiconductor die;
    stacking the interposer substrate along with the first and second semiconductor dies and the underfill element over a package substrate; and
    installing a ring structure on the package substrate through an adhesive layer to surround the first and second semiconductor dies,
    wherein the ring structure has a bottom surface facing the package substrate and a plurality of recessed parts recessed from the bottom surface,
    wherein the plurality of recessed parts comprise a plurality of first recessed parts arranged in at least one corner area of the ring structure and two second recessed parts arranged in two opposite side areas of the ring structure, and
    wherein the portion of the underfill element between the first and the second semiconductor dies is disposed between the two second recessed parts.

2. The method as claimed in claim 1, wherein the plurality of recessed parts further comprise a plurality of third recessed parts arranged in the two opposite side areas of the ring structure and between one of the plurality of first recessed parts and one of the two second recessed parts, and further comprise a plurality of fourth recessed parts arranged in the other two opposite side areas of the ring structure and between two of the plurality of first recessed parts.

3. The method as claimed in claim 1, wherein the plurality of recessed parts extend from an outer edge of the ring structure to an inner edge of the ring structure.

4. The method as claimed in claim 1, wherein a width of each of the two second recessed parts in a first direction is greater than a width of the portion of the underfill element in the first direction.

5. The method as claimed in claim 1, wherein the adhesive layer partially extends into the plurality of recessed parts of the ring structure.

6. The method as claimed in claim 1, further comprising forming the plurality of recessed parts in the ring structure using a punching process.

7. A method for forming a semiconductor die package, comprising:
    disposing a first semiconductor die and a second semiconductor die over an interposer substrate;
    forming an underfill element over the interposer substrate to surround the first and second semiconductor dies, wherein a portion of the underfill element is between the first semiconductor die and the second semiconductor die;
    stacking the interposer substrate along with the first and second semiconductor dies and the underfill element over a package substrate; and
    installing a ring structure on the package substrate through an adhesive layer to surround the first and second semiconductor dies,
    wherein the ring structure has a bottom surface facing the package substrate, and the ring structure includes a first part having a first height and a second part recessed from the bottom surface and having a second height that is lower than the first height,
    wherein the first part comprises a plurality of higher parts arranged side by side in each side area of the ring structure, and the second part comprises a plurality of lower parts between the plurality of higher parts,
    wherein the plurality of lower parts comprise a plurality of first lower parts arranged in at least one corner area of the ring structure and two second lower parts arranged in opposite side areas of the ring structure and aligned with the portion of the underfill element, and
    wherein the adhesive layer is interposed between the bottom surface of the ring structure and the package substrate, wherein the adhesive layer partially extends into the plurality of lower parts.

8. The method as claimed in claim 7, wherein the ring structure has four corner areas and four side areas, wherein two of the four side areas extend in a first direction in which the first and second semiconductor dies are arranged, and the other two of the four side areas extend in a second direction perpendicular to the first direction, and two of the four corner areas are separated from one another by one of the side areas,
    wherein some of the plurality of higher parts are arranged in the two side areas of the ring structure extending in the first direction, and some of the plurality of higher parts are arranged in the two side areas of the ring structure extending in the second direction,
    wherein the plurality of first lower parts comprise four first lower parts arranged in the four corner areas of the ring structure, and each of the plurality of first lower parts is between two of the plurality of higher parts in two adjacent side areas of the ring structure, and
    wherein the two second lower parts are arranged in the two side areas of the ring structure extending in the first direction and are aligned with the portion of the underfill element in the second direction, and each of the two second lower parts is between two of the plurality of higher parts in one of the side areas extending in the first direction.

9. The method as claimed in claim 8, wherein each of the two second lower parts extends from an outer edge of the ring structure to an inner edge of the ring structure in the second direction.

10. The method as claimed in claim 8, wherein a width of each of the two second lower parts in the first direction is greater than a width of the portion of the underfill element in the first direction.

11. The method as claimed in claim 8, wherein the plurality of lower parts further comprise a plurality of third lower parts arranged between some of the plurality of higher parts arranged in the first direction, and each of the plurality of third lower parts extends from the outer edge to the inner edge of the ring structure in the second direction, and
    wherein the plurality of lower parts further comprise a plurality of fourth lower parts arranged between some of the plurality of higher parts arranged in the second direction, and each of the plurality of fourth lower parts extends from the outer edge to the inner edge of the ring structure in the first direction.

12. The method as claimed in claim 11, wherein the width of each of the two second lower parts in the first direction is greater than a width of each of the plurality of third lower parts in the first direction.

13. The method as claimed in claim 11, wherein some of the plurality of higher parts are parallel to the two second lower parts and plurality of third lower parts extending in the second direction, and some of the plurality of higher parts are parallel to the plurality of fourth lower parts extending in the first direction, and
wherein each of the plurality of higher parts extends from the outer edge to the inner edge of the ring structure.

14. The method as claimed in claim 11, wherein some of the plurality of higher parts are parallel to the two second lower parts and plurality of third lower parts extending in the second direction, and some of the plurality of higher parts are parallel to the plurality of fourth lower parts extending in the first direction, and
wherein some of the plurality of higher parts respectively have a first end aligned with the outer edge of the ring structure and a second end protruding from the inner edge of the ring structure.

15. The method as claimed in claim 11, wherein each of the plurality of first lower parts is immediately adjacent to the outer edge of the ring structure and has a first outer lateral edge parallel to the first direction, a first inner lateral edge connected to one of the plurality of higher parts and opposite the first outer lateral edge, a second outer lateral edge parallel to the second direction, and a second inner lateral edge connected to one of the plurality of higher parts and opposite the second outer lateral edge.

16. The method as claimed in claim 15, wherein a width of the first outer lateral edge in the first direction is greater than a width of the plurality of higher parts connected to the first inner lateral edge in the first direction, and a width of the second outer lateral edge in the second direction is greater than a width of the plurality of higher parts connected to the second inner lateral edge in the second direction.

17. The method as claimed in claim 15, wherein a width of the second outer lateral edge in the second direction is greater than a width of each of the plurality of fourth lower parts in the second direction.

18. A method for forming a semiconductor die package, comprising:
disposing a first semiconductor die and a second semiconductor die over an interposer substrate;
forming an underfill element over the interposer substrate to surround the first and second semiconductor dies, wherein a portion of the underfill element is between the first semiconductor die and the second semiconductor die;
stacking the interposer substrate along with the first and second semiconductor dies and the underfill element over a package substrate; and
installing a stress-relief structure on the package substrate through an adhesive layer to surround the first and second semiconductor dies,
wherein the stress-relief structure includes a first flat plate facing the package substrate, a second flat plate opposite the first flat plate, a plurality of connection parts connecting the first and second flat plates, and a plurality of hollow parts between the first flat plate, the second flat plate, and the plurality of connection parts,
wherein the plurality of hollow parts comprise a plurality of first hollow parts arranged in at least one corner area of the stress-relief structure, and
wherein the adhesive layer is interposed between the first flat plate of the stress-relief structure and the package substrate.

19. The method as claimed in claim 18, wherein the plurality of hollow parts further comprise two second hollow parts arranged in two opposite side areas of the stress-relief structure and aligned with the portion of the underfill element.

20. The method as claimed in claim 19, wherein the plurality of hollow parts further comprise a plurality of third hollow parts arranged in the two opposite side areas of the stress-relief structure and between one of the plurality of first hollow parts and one of the two second hollow parts, and further comprise a plurality of fourth hollow parts arranged in the other two opposite side areas of the stress-relief structure and between two of the plurality of first hollow parts.

* * * * *